US009506997B2

(12) United States Patent
Suzuki et al.

(10) Patent No.: US 9,506,997 B2
(45) Date of Patent: Nov. 29, 2016

(54) MAGNETIC-FIELD-ANGLE MEASUREMENT APPARATUS AND ROTATIONAL-ANGLE MEASUREMENT APPARATUS USING SAME

(75) Inventors: Mutsumi Suzuki, Kodaira (JP);
Hiroshi Iwasawa, Hitachinaka (JP);
Masahiro Iwamura, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 971 days.

(21) Appl. No.: 13/697,690

(22) PCT Filed: May 14, 2010

(86) PCT No.: PCT/JP2010/003267
§ 371 (c)(1),
(2), (4) Date: Nov. 13, 2012

(87) PCT Pub. No.: WO2011/141969
PCT Pub. Date: Nov. 17, 2011

(65) Prior Publication Data
US 2013/0063135 A1  Mar. 14, 2013

(51) Int. Cl.
*G01R 33/09* (2006.01)
*G11C 7/06* (2006.01)
*H01L 43/08* (2006.01)

(52) U.S. Cl.
CPC .............. *G01R 33/098* (2013.01); *G11C 7/06* (2013.01); *H01L 43/08* (2013.01)

(58) Field of Classification Search
CPC .............. G11B 2005/0018; G11B 2005/0016; B82Y 25/00; H01L 43/08
See application file for complete search history.

(56) References Cited

U.S. PATENT DOCUMENTS 4,075,671 A * 2/1978 Cheatham ................ G11B 5/39
324/235

5,103,353 A * 4/1992 Jove ....................... G01R 33/09
360/67

(Continued)

FOREIGN PATENT DOCUMENTS

JP    7-007196    1/1995
JP    8-070149    3/1996
(Continued)

OTHER PUBLICATIONS

PCT International Search Report and Written Opinion on application PCT/JP2010/003267 mailed Aug. 17, 2010; 2 pages.

*Primary Examiner* — Jermele M Hollington
*Assistant Examiner* — Dustin Dickinson
(74) *Attorney, Agent, or Firm* — Foley & Lardner LLP

(57) ABSTRACT

In a magnetic-field angle detection device and a rotation angle detection device in which the accuracy of the measured angle is not degraded even if the MR ratio of the tunneling magnetoresistance element is increased. In a magnetic-field-angle measurement apparatus including a magnetic-field-angle detection circuit and a magnetic sensor having a tunneling magnetoresistance element with a pinned magnetic layer, the magnetic-field-angle detection circuit has a power-supply unit that outputs a constant voltage as a bias voltage to the tunneling magnetoresistance element of the magnetic sensor and a current-detection unit that detects an output current of the tunneling magnetoresistance element. The accuracy of the measured angle of the magnetic-field angle detection device and the rotation angle detection device is improved by measuring the tunneling magnetoresistance element current while maintaining the terminal voltage of the tunneling magnetoresistance element constant with input impedance of the current-detection unit as zero.

4 Claims, 12 Drawing Sheets

(56) References Cited

U.S. PATENT DOCUMENTS

| | | | |
|---|---|---|---|
| 5,552,706 A | 9/1996 | Carr | |
| 6,232,777 B1 | 5/2001 | Sato | |
| 7,786,725 B2 | 8/2010 | Furukawa et al. | |
| 7,848,043 B1* | 12/2010 | Voo | G11B 5/3903 360/31 |
| 8,106,649 B2 | 1/2012 | Kaita et al. | |
| 2003/0070497 A1* | 4/2003 | Kikuchi | G01D 5/145 73/862.333 |
| 2007/0047152 A1 | 3/2007 | Furukawa | |
| 2008/0012557 A1* | 1/2008 | Hammerschmidt | B82Y 25/00 324/252 |
| 2008/0054896 A1 | 3/2008 | Kahlman | |
| 2010/0007340 A1 | 1/2010 | Kaita | |
| 2010/0026289 A1* | 2/2010 | Taylor | G01R 33/093 324/252 |
| 2010/0219822 A1 | 9/2010 | Suzuki | |
| 2010/0321006 A1 | 12/2010 | Suzuki | |
| 2011/0025322 A1* | 2/2011 | Yamazaki | G01R 33/0005 324/252 |
| 2011/0115477 A1 | 5/2011 | Suzuki | |

FOREIGN PATENT DOCUMENTS

| | | |
|---|---|---|
| JP | 10-293040 | 4/1998 |
| JP | 10-293040 A | 11/1998 |
| JP | 10-341049 | 12/1998 |
| JP | 11-068192 | 3/1999 |
| JP | 2000-091664 | 3/2000 |
| JP | 2000-123328 A | 4/2000 |
| JP | 2001-281313 | 10/2001 |
| JP | 2001-281313 A | 10/2001 |
| JP | 2007-64813 | 3/2007 |
| JP | 2007-064813 A | 3/2007 |
| JP | 2008-522146 | 6/2008 |
| JP | 2008-522146 A | 6/2008 |
| JP | 2010-44046 | 2/2010 |
| JP | 2010-044046 A | 2/2010 |
| JP | 2010-197318 A | 9/2010 |
| JP | 2001-002311 A | 1/2011 |
| JP | 2011-106935 A | 6/2011 |
| JP | 2012-137457 A | 7/2012 |
| WO | WO 2006/056936 A2 | 6/2006 |
| WO | WO 2009/108420 | 9/2009 |

* cited by examiner

MAGNETIC-FIELD-ANGLE MEASUREMENT APPARATUS AND ROTATIONAL-ANGLE MEASUREMENT APPARATUS USING SAME

TECHNICAL FIELD

The present invention relates to a magnetic-field-angle measurement apparatus configured by using a tunneling magnetoresistance element (TMR element) with a pinned magnetic layer and a rotation-angle measurement apparatus using the same.

BACKGROUND ART

In a magnetic-field-angle measurement apparatus which measures the angle of magnetic field (magnetic-field angle) or a rotation-angle measurement apparatus which measures the rotation angle of a rotation unit by measuring the magnetic-field angle of a magnet fixed to the rotation unit, the measurement characteristics depend on a sensor element which detects the angle of the magnetic field. As such a magnetic-field-angle measurement apparatus or rotation-angle measurement apparatus, devices using a magnetoresistance element (MR element) have been known in the related art.

An anisotropic magnetoresistance element (AMR element), a giant magnetoresistance element (GMR element), a tunneling magnetoresistance element (TMR element), and the like are known as MR elements. In these elements, the resistance value of each element changes if the angle of external magnetic field (magnetic-field angle) or the external magnetic field strength changes.

As measurement performance of the magnetic-field-angle measurement apparatus, the S/N ratio (signal-to-noise ratio) is an important figure of merit.

The S/N ratio of the MR element is dominated by the amount of change in the resistance of element to changes in the magnetic-field angle. The S/N ratio is improved as the rate of change of the value of the resistance of element to a fixed magnetic-field angle change increases. The maximum rate of change of the resistance value due to changes in magnetic-field angle is called an MR ratio. The MR ratio is about 2% in the AMR element and about 10% in the GMR element, while the MR ratio reaches 50% or more in the TMR element.

In particular, the MR ratio of the TMR element has exceeded 100% due to improvements or the like in a tunnel-insulator layer used in the element in recent years, and a TMR element with the MR ratio of even 600% has also been reported.

As a sensor which detects the rotation angle of the rotation unit using a TMR element, for example, a magnetic encoder disclosed in PTL 1 is known.

The present invention relates to a magnetic-field-angle measurement apparatus and a rotation-angle measurement apparatus which use a TMR element. In particular, the present invention relates to a magnetic-field-angle measurement apparatus using a TMR element with a high MR ratio and a rotation-angle measurement apparatus using the same.

As a form of GMR element, there is a granular GMR element formed by dispersing paramagnetic particles with a diameter of about 5 nm in an insulating material. Electrons tunnel among the paramagnetic particles, so that current flows through the granular GMR element. If the external magnetic field changes, the angle of magnetic field in paramagnetic particles also changes, and the resistance value of the layer changes accordingly. Since the operation of the granular GMR element is based on the tunneling phenomena between particles, the granular GMR element is sometimes regarded as a tunneling magnetoresistance element. However, the MR ratio is only about 10%. In addition, since the granular GMR element is an element that does not have a pinned magnetic layer, it is not covered in the present invention.

FIG. 21 shows a structure of a TMR element having a pinned magnetic layer. The TMR element 51 has a layered structure in which a tunnel-insulator layer 12 is interposed between a pinned magnetic layer (pinned layer) 13 and a free magnetic layer (free layer) 11. The pinned magnetic layer 13 and the free magnetic layer 11 are formed of a magnetic material having components of Co, Fe, Ni, and the like, for example. The tunnel-insulator layer 12 is formed of an insulator, such as aluminum oxide ($Al_2O_3$) or magnesium oxide (MgO), and the film thickness is about 0.5 to 2 nm.

The angle of magnetization 22 in the pinned magnetic layer 13 is fixed in a predetermined direction at the angle θp, and is not changed by the external magnetic field 30. On the other hand, the angle of magnetization 20 in the free magnetic layer 11 changes at the angle θf according to the angle θm of the angle of external magnetic field 30.

In the TMR element, the resistance value between the pinned magnetic layer 13 and the free magnetic layer 11 changes depending on the angular difference Δθ=θf−θp between the angles of magnetization. The resistance value of the TMR element is a minimum value R(P) when the angular difference Δθ between the angles of magnetization of the free magnetic layer 11 and the pinned magnetic layer 13 is 0 (Parallel) and is a maximum value R(AP) when the angular difference Δθ between the angles of magnetization is 180° (Anti-Parallel). The MR ratio (MR) of the TMR element is defined by the following Expression.

$$MR = \frac{R(AP) - R(P)}{R(P)} = \frac{R(AP)}{R(P)} - 1 \qquad \text{[Expression 1]}$$

In the related art disclosed in PTL 1, a rotating magnetic unit in which N and S poles of a magnet are alternately disposed is provided in a rotation unit to be measured, and the angle of the magnetic field which reverses according to the rotation of the rotation unit is detected by a TMR element. In this case, the TMR elements are arranged in a bridge configuration and used as a magnetic encoder.

FIG. 22 shows a bridge configuration 60 including four TMR elements. Magnets are disposed with repetition interval of λ in the rotation unit which is an object to be detected that is in the rotation state. Corresponding to this, TMR elements 51a, 51b, 51c, and 51d are provided with interval of λ/4. Accordingly, since the TMR elements 51a and 51c are provided with interval of λ/2, the angle of the magnetic field at the position of the TMR element 51c is θ=θ0+180° when the angle of the magnetic field at the position of the TMR element 51a is θ=θ0. Therefore, as described above, when the resistance value of the TMR element at the excitation voltage e0 side is a maximum value in the bridge configuration shown in FIG. 22, the TMR element at the ground (GND) side of 0 V has a minimum resistance value. In this manner, at the voltage between signal terminals (V2−V1), a signal change according to the rotation state of the rotation unit is observed.

In order to improve the measurement accuracy of the rotation angle of the rotation unit in the method disclosed in PTL 1, it is necessary to narrow the repetition interval of magnetization by increasing the number of poles of magnetization of the rotation unit so that the angle of the magnetic field is reversed even when the rotation angle changes slightly. In this case, however, the manufacturing cost increases.

In contrast, there is a method of measuring the magnetic-field angle, which changes in a range of $\theta=0$ to 360°, without increasing the number of poles of magnetization of a magnet when measuring the rotation angle of the rotation unit. In this case, however, it is difficult to measure the magnetic-field angle accurately. In particular, the inventor has found a problem in that a decrease in measurement accuracy is more noticeable when a TMR element with a large MR ratio exceeding 100% is used.

CITATION LIST

Patent Literature

[PTL 1] JP-A-2000-123328

SUMMARY OF INVENTION

Technical Problem

In a magnetic-field-angle measurement apparatus using a TMR element with a pinned magnetic layer and a rotation-angle measurement apparatus using the same, there have been problems in that it is difficult to improve the measurement accuracy of the magnetic-field angle or the rotation angle and in particular, a decrease in measurement accuracy is more noticeable when a TMR element with a large MR ratio is used. The present invention has been made in order to solve the above-described problems. According to the present invention, there are provided a magnetic-field-angle measurement apparatus capable of measuring the magnetic-field angle with high accuracy even if a TMR element with a high MR ratio is used and a rotation-angle measurement apparatus using the same which can measure the rotation angle with high accuracy.

Solution to Problem

The present invention is a magnetic-field-angle measurement apparatus including a magnetic sensor and a magnetic-field-angle detection circuit and is characterized in that the magnetic sensor has a tunneling magnetoresistance element (TMR element) with a pinned magnetic layer, the magnetic-field-angle detection circuit has a power-supply unit that outputs a constant voltage as a bias voltage to the TMR element of the magnetic sensor and a current-detection unit that detects a flowing current of the TMR element, and input impedance of the current-detection unit is set to zero.

In addition, the magnetic-field-angle measurement apparatus is characterized in that the current-detection unit has an operational amplifier that detects a flowing current of the TMR element and the input impedance of the current-detection unit is set to zero by connecting the input terminal of the operational amplifier to virtual ground.

In addition, the magnetic-field-angle measurement apparatus is characterized in that the power-supply unit outputs a constant voltage of a pulsed voltage as a bias voltage to the TMR element of the magnetic sensor.

In addition, the magnetic-field-angle measurement apparatus is characterized in that the magnetic sensor has two TMR elements in which angles of magnetization of the pinned magnetic layers are different from each other by 90°.

In addition, the magnetic-field-angle measurement apparatus is characterized in that the TMR element of the magnetic sensor has first and second feeding terminals and a first sensing terminal, the magnetic-field-angle detection circuit has a power-supply unit that outputs a constant voltage as a bias voltage to the TMR element of the magnetic sensor and a current-detection unit that detects an output current of the TMR element, a terminal voltage of the TMR element is detected through the first sensing terminal, and the power-supply unit performs feedback control such that the terminal voltage matches a predetermined voltage value.

In addition, the magnetic-field-angle measurement apparatus is characterized in that the TMR element has a second sensing terminal in addition to the first sensing terminal and the terminal voltage of the TMR element is detected through the first and second sensing terminals.

In addition, the magnetic-field-angle measurement apparatus is characterized in that the power-supply unit has a differential amplifier with differential inputs of an output voltage of the first sensing terminal and an output of a reference-voltage generation unit.

In addition, the magnetic-field-angle measurement apparatus is characterized in that the power-supply unit generates a pulsed voltage.

In addition, the magnetic-field-angle measurement apparatus is characterized in that the magnetic sensor has two TMR elements in which angles of magnetization of the pinned magnetic layers are different from each other by 90°.

In addition, the present invention is a magnetic-field-angle measurement apparatus including a magnetic sensor and a magnetic-field-angle detection circuit and is characterized in that the magnetic sensor has a TMR element with a pinned magnetic layer, the magnetic-field-angle detection circuit has a current-supply unit and a current-detection unit that detects an output current of the TMR element, the current-supply unit has a voltage-input terminal connected to a voltage-generation unit, a current-input terminal to which a current from the current-detection unit is input, and a current-output terminal through which a current is output to the magnetic sensor, a flowing current of the current-input terminal and a flowing current of the current-output terminal are equal, a voltage of the current-output terminal is set on the basis of a voltage of the voltage-generation unit, and the current-detection unit is connected to the current-input terminal of the current-supply unit, and the magnetic sensor is connected to the current-output terminal.

In addition, the magnetic-field-angle measurement apparatus is characterized in that the current-supply unit has a field-effect transistor and a current-supply unit operational amplifier and one terminal of the field-effect transistor and the voltage-generation unit are connected to input terminals of the current-supply unit operational amplifier.

In addition, the magnetic-field-angle measurement apparatus is characterized in that the current-supply unit has a transistor with a base to which an output voltage of the voltage-generation unit is input.

In addition, the magnetic-field-angle measurement apparatus is characterized in that the voltage-generation unit generates a pulsed voltage.

In addition, the magnetic-field-angle measurement apparatus is characterized in that the magnetic sensor has two TMR elements in which angles of magnetization of the pinned magnetic layers are different from each other by 90°.

In addition, the magnetic-field-angle measurement apparatus is characterized in that the magnetic-field-angle detection circuit has the two current-supply units and the current-supply units are electrically connected to the two TMR elements, respectively.

In addition, there is provided a rotation-angle measurement apparatus including the magnetic-field-angle measurement apparatus described above and a magnet fixed to a rotation unit.

Advantageous Effects of Invention

As described above, according to the present invention, in a magnetic-field-angle measurement apparatus including a magnetic sensor and a magnetic-field-angle detection circuit, the magnetic sensor has a TMR element with a pinned magnetic layer, and the magnetic-field-angle detection circuit has a power-supply unit that outputs a constant voltage as a bias voltage to the TMR element of the magnetic sensor and a current-detection unit that detects a flowing current of the TMR element. By setting the input impedance of the current-detection unit to zero, the voltage between the terminals of the magnetic sensor having a TMR element can always be maintained constant. Accordingly, it is possible to provide a magnetic-field-angle measurement apparatus capable of measuring the magnetic-field angle with high accuracy even if a TMR element with a high MR ratio is used. In addition, using the high-accuracy magnetic-field-angle measurement apparatus, it is possible to provide a rotation-angle measurement apparatus capable of measuring the rotation angle with high accuracy.

DESCRIPTION OF EMBODIMENTS

Hereinafter, embodiments of the present invention will be described in detail with reference to the drawings.

First Embodiment

A first embodiment of a magnetic-field-angle measurement apparatus using the present invention will be described. Here, the configuration of the present embodiment will be described after understanding the cause of the problem of the conventional configuration.
(TMR Element Structure)

Figure 21:
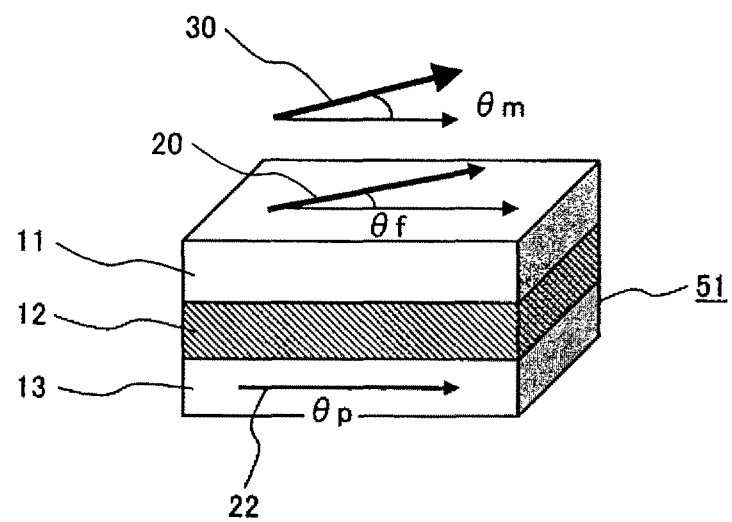
FIG. 21 is a schematic diagram showing the configuration of a TMR element in the related art.

In the first embodiment, a TMR element with the structure described in FIG. 21 is used. In the first embodiment, MgO is used as a tunnel-insulator layer. If MgO is used as the tunnel-insulator layer 12, the MR ratio is increased 100% or more. In addition, the MR ratio may be further increased if single-crystal MgO is used. Aluminum oxide ($Al_2O_3$) may also be used as a tunnel-insulator layer.

When the conductance G is used instead of the resistance, the conductance of the TMR element becomes a maximum value G(P) in the case of parallel angle of magnetization ($\Delta\theta=0$) and a minimum value G(AP) in the case of anti-parallel angle of magnetization ($\Delta\theta=180°$). The following Expression is obtained if the MR ratio defined by (Expression 1) is expressed using the conductance.

$$MR = \frac{R(AP) - R(P)}{R(P)} = \frac{R(AP)}{R(P)} - 1 = \frac{G(P)}{G(AP)} - 1 \quad \text{[Expression 2]}$$

Between $\Delta\theta=0$ and $\Delta\theta=180°$, the MR ratio is based on the following Expression. In addition, hereinafter, the angle of magnetization $\theta p$ of the pinned magnetic layer is set as $\theta p=0$ and $\Delta\theta$ is expressed as $\theta$. That is, the angle of magnetization of the pinned magnetic layer is used as an angle reference (origin).

$$G(\theta) = G_0 + \frac{T}{2}\cos\theta = G_0 + \frac{G_0\beta_g}{2}\cos\theta \quad \text{[Expression 3]}$$

Here, T is a TMR coefficient, and $\beta g$ is a conductance-modulation factor due to changes in magnetic field. $\beta g$ is expressed by the following Expression.

$$\beta_g = \frac{T}{G_0} \quad \text{[Expression 4]}$$

As shown in (Expression 3), the conductance, rather than the resistance, is proportional to $\cos\theta$. Theoretically, a magnetic-field dependent term of the conductance is proportional to cos θ. When the MR ratio is as small as about 10% as in a GMR element, even if a magnetic-field dependent term of the resistance is proportional to cos θ, large error does not occur even if it is assumed that the magnetic-field dependent term of the conductance is proportional to cos θ. However, if the MR ratio exceeds 50% as in a TMR element, large error occurs if it is assumed that the magnetic-field dependent term of the resistance is proportional to cos θ.

From (Expression 2) and (Expression 3), the relationship between the conductance-modulation factor βg and the MR ratio MR is obtained as follows.

$$\beta_g = \frac{2MR}{MR+2} \quad \text{[Expression 5]}$$

As can be seen from (Expression 5), for example, in the case of MR ratio=2 (200%), the conductance-modulation factor βg reaches 100%. Since the conductance-modulation factor of the GMR element is about 10%, it can be seen that the conductance change of the TMR element by the magnetic field is about 10 times greater than that of the GMR element.

(Measurement Accuracy of a Magnetic-Field-Angle Measurement Apparatus)

Figure 22:
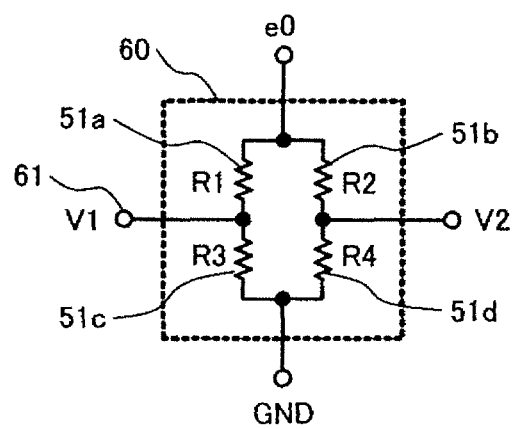
FIG. 22 is a circuit diagram showing the bridge configuration of the TMR element in the related art.

Here, the reason why the measurement accuracy has been degraded in a magnetic-field-angle measurement apparatus especially using a TMR element with a large MR ratio will be described. For the voltage (hereinafter, referred to as an element bias voltage) across the TMR element 51c in the bridge configuration 60 shown in FIG. 22, when the external magnetic-field angle θ is 0, the resistance value of the TMR element 51a is R(P) and the resistance value of the TMR element 51c is R(AP) as described above. Accordingly, the voltage V1 of a signal terminal 61, that is, the element bias voltage V1 of the TMR element 51c is expressed by the following Expression.

$$V_1(\theta = 0) = \frac{R(AP)}{R(P)+R(AP)} e_0 = \frac{MR+1}{MR+2} e_0 \quad \text{[Expression 6]}$$

e0 is an excitation voltage of the bridge. On the other hand, when the external magnetic-field angle θ is 180° (θ=180°), the voltage V1 is expressed by the following Expression.

$$V_1(\theta = 180°) = \frac{R(P)}{R(P)+R(AP)} e_0 = \frac{e_0}{MR+2} \quad \text{[Expression 7]}$$

As an example, when a case is considered in which the MR ratio is 200% and the bridge excitation voltage e0 is 0.4 V, V1(θ=0)=0.3 V and V1(θ=180°)=0.1 V. The angle of magnetization 20 of the free magnetic layer is equal to the angle of external magnetic field 30. This indicates that the bias voltage of the TMR element 3 changes in a range of 0.1 to 0.3 V due to the angle of external magnetic field 30. Hereinafter, V1(θ=x) is denoted as V1(x).

Figure 1:
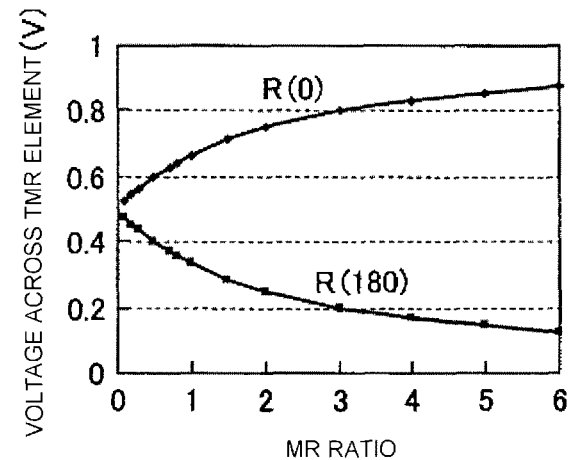
FIG. 1 is a graph showing the relationship between the MR ratio and a voltage between terminals of a TMR element having a bridge configuration.
Figure 2:
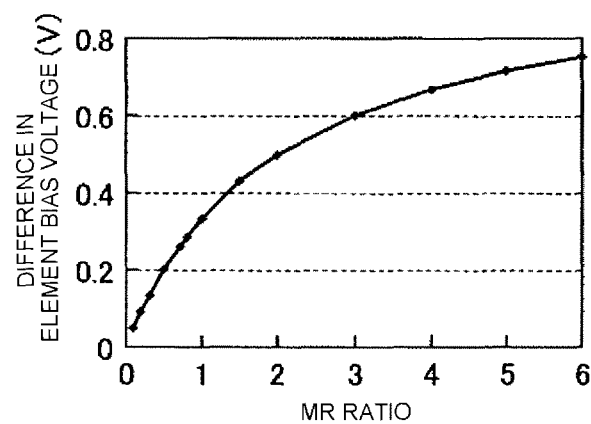
FIG. 2 is a graph showing the relationship between the MR ratio and a voltage difference between terminals of the TMR element in FIG. 1.

FIG. 1 is a graph obtained by plotting V1(0) and V1(180°) as a function of the MR ratio, and FIG. 2 is a graph obtained by plotting the variation V1(0)-V1(180°) of the element bias voltage as a function of the MR ratio.

As the value on the horizontal axis in FIG. 1, "1" indicates the MR ratio of 100% and "2" indicates the MR ratio of 200%. As can be seen from FIG. 22, V1(0) and V1(180°) are equal to element bias voltages of the TMR element 51c, that is, voltages across the TMR element at the time of θ=0 and 180°, respectively. (Expression 6) and (Expression 7) are used for the plot. In both FIGS. 1 and 2, the value normalized by dividing the voltage by the bridge excitation voltage e0 is plotted on the vertical axis. For example, "0.5" in the drawings indicates that the voltage is "0.5×e0".

As shown in FIG. 2, when the MR ratio is as small as about 10%, the variation of the element bias voltage is almost zero. However, when the MR ratio exceeds 1000 (region of "MR ratio>1" on the horizontal axis in FIGS. 5 and 6), it can be seen that the variation V1(0)-V1(180°) of the element bias voltage exceeds about 0.3 e0 and changes up to about ⅓ of the bridge excitation voltage.

(Bias Voltage Dependence of the MR Ratio)

Figure 3:
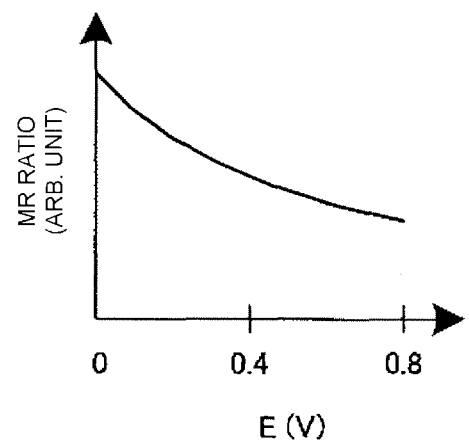
FIG. 3 is a graph showing the relationship between the MR ratio of the TMR element and an element bias voltage.

FIG. 3 is a graph showing an example of the relationship between the MR ratio of the TMR element and the bias voltage E (applied voltage E across the element). For example, as is known by the following document, the MR ratio changes greatly with the bias voltage E.

"Japanese Journal of Applied Physics, Vol. 44, No. 19, 2005, and pp. L 587-L 589"

Figure 4A:
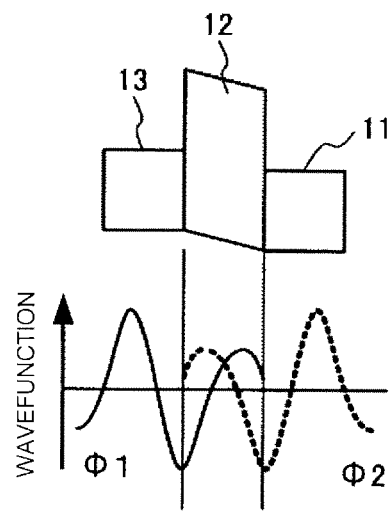
FIG. 4A is a schematic diagram illustrating the mechanism of electron conduction of the TMR element.
Figure 4B:
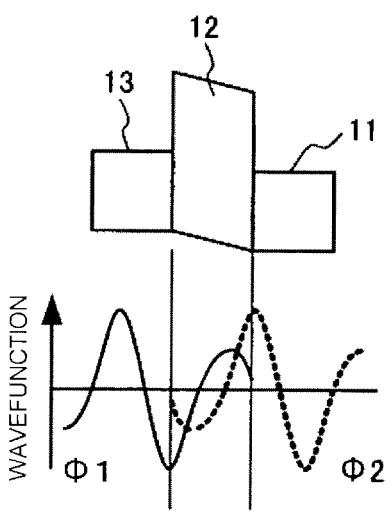
FIG. 4B is a schematic diagram illustrating the mechanism of electron conduction of the TMR element.

It is a characteristic of the TMR element that the MR ratio changes with the bias voltage. This is based on the following reason. The electronic conduction phenomenon between the pinned magnetic layer and the free magnetic layer in the TMR element is due to interaction between the two wavefunctions of the pinned and free magnetic layers. Each of the wavefunctions penetrates into the tunnel-insulator layer from the respective magnetic layer. FIGS. 4A and 4B are electron's energy-band diagrams. In each of FIGS. 4A and 4B, an electron's energy-band diagram is schematically shown in the upper side of the figure; the lower side of each figure is a schematic illustration of the two wavefunctions, φ1 and φ2, (including spin-state) of electrons in the pinned magnetic layer (13) and the free magnetic layer (11), respectively. If the two wavefunctions φ1 and φ2 have spin-states of the same direction, as shown in FIG. 4A, then the two wavefunctions couple to each other to form conduction paths of electrons between the pinned (13) and free (11) magnetic layers, thus causing electric current flow. On the other hand, if the two wavefunctions φ1 and φ2 have spin-states of the different direction, as shown in FIG. 4B, then the two wavefunctions cancel each other, thus causing no conduction path for electrons, and making the TMR element in high-resistance state.

When the element bias voltage is increased, wavefunctions in excited states contribute to the interaction, in addition to the interaction between the wavefunctions in the ground state. Wavefunctions of different excited states do not necessarily cancel each other even if the two wavefunctions have spin-state of anti-parallel. Therefore, a TMR element under a high element bias voltage does not exhibit the high-resistance state. With this mechanism, as the element bias voltage increases, R(AP) decreases, thus causing the MR ratio decrease.

(Cause of Degradation of the Measurement Accuracy)

Based on the above points, the cause of degradation of the measurement accuracy in a magnetic-field-angle measurement apparatus using a TMR element will be described. In the magnetic-field-angle measurement apparatus using a TMR element, the magnetic-field angle θ is calculated from a conductance change (or a resistance change) on the basis of the relationship of (Expression 3). However, if the MR ratio changes with the angle of the magnetic field, the conductance-modulation factor βg also changes according to (Expression 5). As a result, a proportionality coefficient of cos θ in (Expression 3) changes. For this reason, an error occurs when calculating the magnetic-field angle from the conductance variation. This is a cause of the degradation of the measurement accuracy. As can be seen from (Expression 6) and (Expression 7), this problem becomes noticeable as the MR ratio increases.

In addition, even if a method of measuring the voltage between both terminals by making a constant current flow through a TMR element is used instead of using the bridge configuration, the measurement accuracy is degraded since the voltage between both terminals changes with the angle of the magnetic field.

In addition, also when applying a constant voltage to the TMR element and measuring an element current using a detection resistor, the amount of voltage drop caused by the detection resistor changes if the current changes. As a result, since the voltage across the TMR element changes, the same problem as above occurs.

(Magnetic-Field-Angle Measurement Apparatus of the Present Invention)

Figure 5:
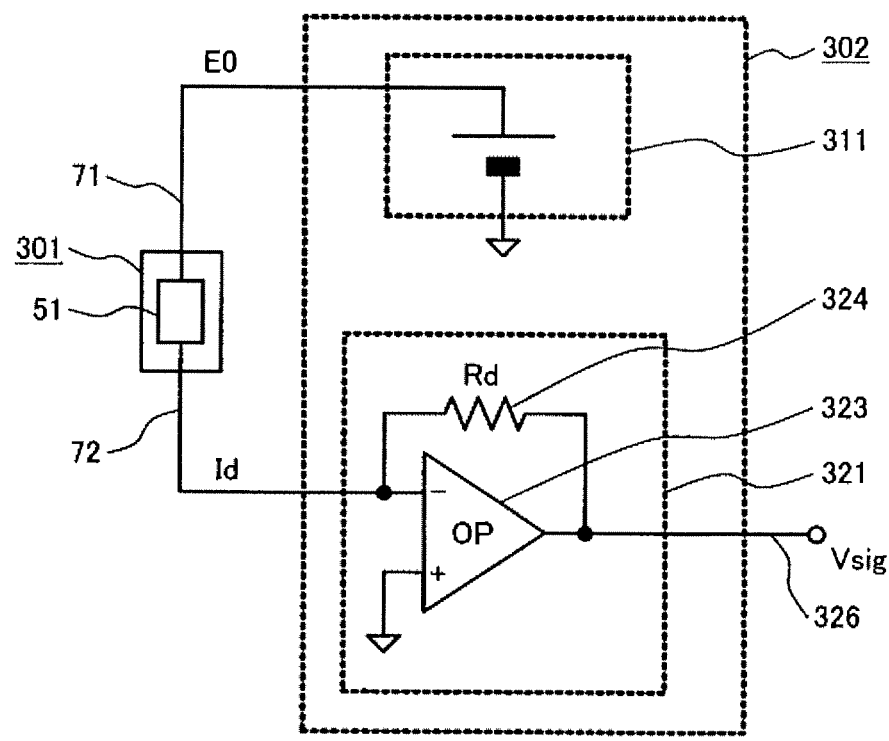
FIG. 5 is a circuit diagram showing the configuration of the first embodiment of the present invention.

FIG. 5 shows the configuration of the magnetic-field-angle measurement apparatus of the first embodiment according to the present invention. The magnetic-field-angle measurement apparatus of the first embodiment is configured to include a magnetic sensor 301 with the tunneling magnetoresistance (TMR) element 51 and a magnetic-field-angle detection circuit 302. 71 is a first feeding terminal of the magnetic sensor 301, and 72 is a second feeding terminal.

The magnetic-field-angle detection circuit 302 includes a power-supply unit 311, which supplies a constant voltage to the TMR element 51, and a current-detection unit 321. The current-detection unit 321 is formed of a current-follower circuit (also referred to as a current-voltage conversion circuit) using an operational amplifier (OP amplifier) 323. In addition, a downward triangle in drawings of the present invention means grounding to a common voltage. 324 is a feedback resistor, and 326 is a signal output terminal.

The characteristic of the current-detection unit 321 of the first embodiment is that the ground-side terminal of the TMR element 51 is connected to a virtual ground terminal of the operational amplifier 323. For this reason, the ground-side terminal of the TMR element 51 becomes a ground voltage regardless of element current. Here, the virtual ground terminal refers to a terminal whose electric potential is equal to that of the ground terminal in the circuit configuration of an operational amplifier. As shown in FIG. 5, when an output terminal of the operational amplifier 323 is connected to an input terminal (−) and an input terminal (+) of the operational amplifier 323 is grounded, voltages of both the input terminals are equally 0 V as described above. Here, a reference voltage at the time of virtual grounding may be a constant voltage other than 0 V. Although the ground voltage is not limited to a certain range, the ground voltage is set to 0 V in the first embodiment.

Since the constant voltage is supplied from the power-supply unit 311, the bias voltage of the TMR element 51 is kept constant regardless of the magnitude of element current by adopting such a circuit configuration. Accordingly, the MR ratio is fixed and the conductance-modulation factor defined by (Expression 4) is also fixed. Accordingly, it is possible to calculate the magnetic-field angle accurately.

Assuming that the element current is Id, the output signal voltage Vsig of the current-detection unit 321 is −Id×Rd. Assuming that the output voltage of the power-supply unit 311 is E0, the conductance of the TMR element 51 is calculated as Id/E0. Accordingly, the magnetic-field angle θ can be calculated from (Expression 3).

In addition, although two constants of $G_0$ and T in (Expression 3) are unknown, conductance G(0) and conductance G(180°) are measured in a condition in which the external magnetic-field angle is set to two states of θ=0 and θ=180° and the constant T is calculated from the difference between the conductance G(0) and the conductance G(180°). Then, the constant G0 is calculated from the average of the conductance G(0) and the conductance G(180°).

Thus, by connecting one side of the TMR element 51 to the power-supply unit 311 which supplies the constant voltage $E_0$ and connecting the other side to the current-detection unit 321 whose input impedance is zero, an accurate magnetic-field-angle measurement apparatus can be realized. Here, "impedance is zero" means that the substantial impedance is 0. That is, the impedance does not need to be 0 in a strict sense, and may be a value with a certain width.

Second Embodiment

Figure 6:
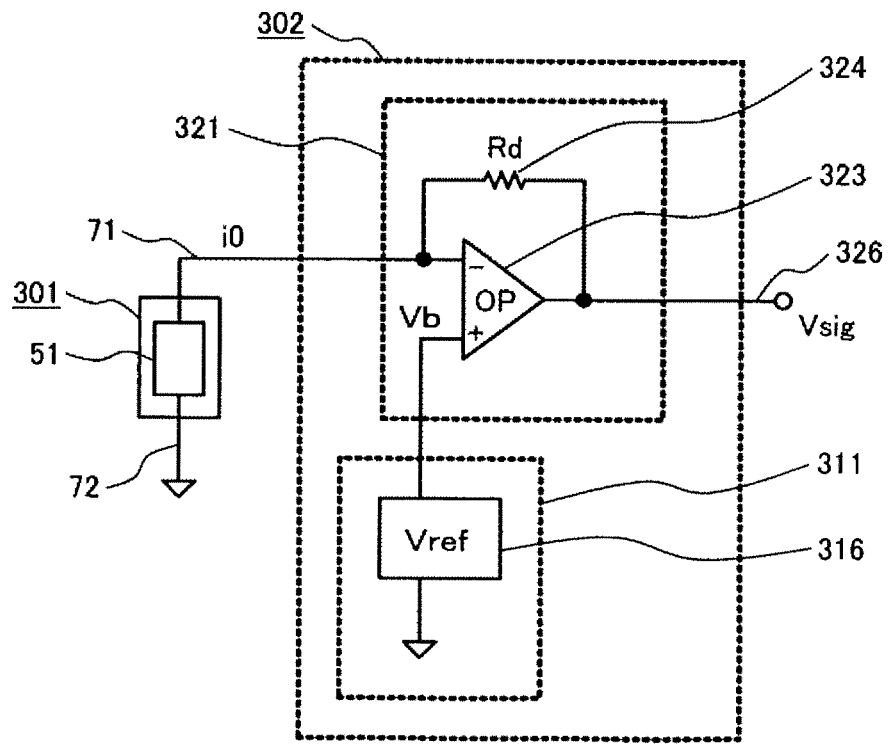
FIG. 6 is a circuit diagram showing the configuration of the second embodiment of the present invention.

Next, a second embodiment of the present invention will be described with reference to FIG. 6. FIG. 6 shows another circuit configuration of the magnetic-field-angle detection circuit 302 in the first embodiment. In the second embodiment, the magnetic-field-angle detection circuit 302 is configured to include the power-supply unit 311 and the current-detection unit 321. The power-supply unit 311 is configured to include a reference-voltage generation unit 316, and generates a voltage Vb. The current-detection unit 321 is configured to include an operational amplifier 323 and a feedback resistor 324. A voltage of feeding terminal of the magnetic sensor 301 and an output voltage of the power-supply unit 311 are input to input terminals of the operational amplifier 323.

In the configuration shown in FIG. 6, the terminal voltage of the magnetic sensor 301 is equal to the voltage Vb generated by the power-supply unit 311 due to the function of the operational amplifier 323. In addition, an output signal voltage Vsig of a signal output terminal 326 of the current-detection unit 321 is (Rd×i0+Vb). Here, Rd is the resistance value of the feedback resistor 324, and i0 is a TMR element current of the magnetic sensor 301.

According to the configuration of the second embodiment, the voltage between terminals of the magnetic sensor 301 is kept constant as Vb regardless of the magnitude of element current of the magnetic sensor 301 with a TMR element. Therefore, also when a TMR element with a high MR ratio is used, it is possible to measure the magnetic-field angle with high accuracy.

In addition, in the configuration shown in FIG. 6, all signals are positive voltages. Accordingly, since the power supply of an operational amplifier or the like has only a positive voltage, there is an advantage in that the power supply can be realized at a low cost. In addition, the voltage of the input terminal is fixed as Vb regardless of the magnitude of the current (i0) flowing through the input terminal of the current-detection unit 321. Accordingly, the input impedance of the input terminal is zero as in the first embodiment.

In the configuration of the second embodiment, the input terminal of the current-detection unit 321 is virtually grounded to the electric potential Vb by being connected to the input terminal of the operational amplifier 323. In this manner, the voltage between the terminals of the magnetic sensor 301 having a TMR element can be fixed.

Third Embodiment

In a third embodiment, an example of a detection circuit using a pulsed-voltage power supply is shown. A power-supply unit which outputs a pulsed voltage shown in FIG. 7 is used.

Figure 7:
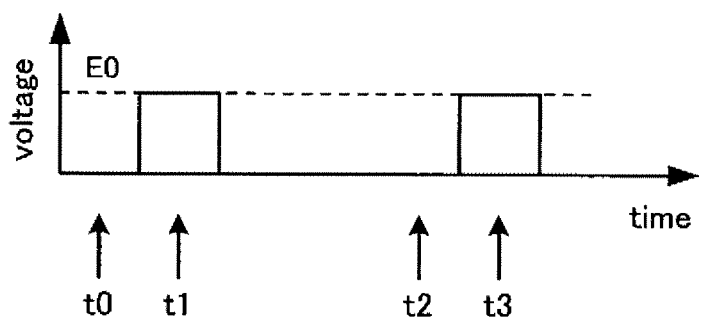
FIG. 7 is a graph showing pulse supply voltage of the third embodiment of the present invention.

That is, as shown in FIG. 7, a magnetic-field-angle detection circuit measures a current measurement value (zero-point current) Iz at time t0 at which 0 V is output and a current measurement value Idm at time t1 at which the element bias voltage E0 is output, and calculates a difference (Idm−Iz) between both the measurement values. Since a drift or offset of the magnetic-field-angle detection circuit section can be removed in real time, high-accuracy measurement is possible.

Figure 8:
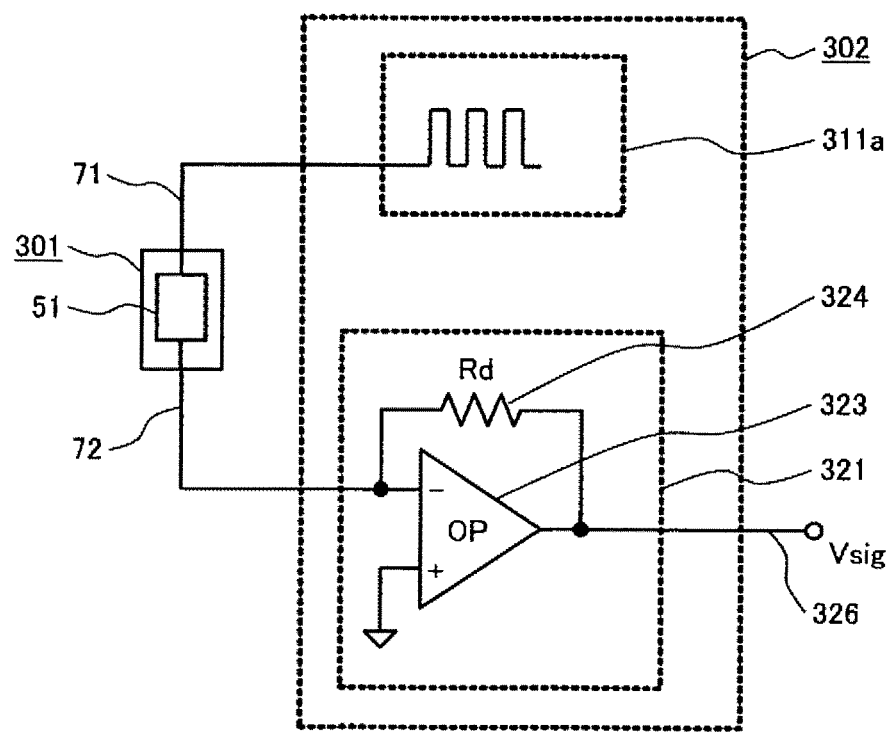
FIG. 8 is a circuit diagram showing the configuration of the third embodiment of the present invention.

The circuit configuration in this case is shown in FIG. 8. In FIG. 8, the power-supply unit 311 in FIG. 5 is replaced with a power-supply unit 311a. When the power-supply unit 311a which outputs the pulsed voltage shown in FIG. 7 is provided in the magnetic-field-angle detection circuit 302 and a voltage applied to the TMR element 51 is pulsed, electric power supplied to the TMR element 51 is reduced, and this suppresses heating of the element. Accordingly, since a drift of element current is reduced, it is possible to obtain an accurate measurement result with good reproducibility. In addition, degradation of the TMR element is less likely to occur because electric power supplied to the TMR element 51 is reduced. Also on this point, the present invention is preferable.

The pulse width is preferably 1 μs to 10 ms, and the duty factor of pulse, that is, (pulse width/pulse repetition period) is preferably 0.01 to 0.5. Since the duty factor of pulse has an effect on the average value of electric power supplied to the TMR element, it is important to set the duty factor of pulse to an appropriate value. In the third embodiment, the pulse width, the pulse repetition period, and the duty factor are set to 100 μs, 1 ms, and 0.1, respectively.

In this manner, there is no drift in the detected current. As a result, an accurate angle measurement result could be obtained. Also in the circuit configuration shown in FIG. 9 of a fourth embodiment described below, the same effect can be obtained by pulsing the output voltage of the power-supply unit 311.

Fourth Embodiment

Next, a magnetic-field-angle measurement apparatus of a fourth embodiment of the present invention will be described using FIG. 9. The element bias voltage of the TMR element 51 is as small as 1 V or less in many cases. In addition, as shown in FIG. 3, a higher MR ratio is obtained as the bias voltage becomes lower. Therefore, in order to increase the S/N ratio in magnetic-field angle measurement, it is preferable to set a low bias voltage.

The preferable bias voltage depends on the design of a TMR element, especially, on the film thickness of a tunnel-insulator layer. For example, in the TMR element with the characteristic shown in FIG. 3, the bias voltage is about 0.1 to 0.3 V.

When the bias voltage is low in this way, a voltage drop across the stray resistance becomes a problem. Here, the stray resistance is resistance other than resistance of a tunnel junction (portion of the free magnetic layer 11/tunnel-insulator layer 12/pinned magnetic layer 13 in FIG. 2) of the TMR element 51 on the path of "power-supply unit 311→TMR element 51→current-detection unit 321" of the magnetic-field-angle detection circuit. The following things are included.

(a) Wire resistance between the magnetic-field-angle detection circuit 302 and a TMR element (b) Wire bonding resistance between a terminal in a TMR-element package and a pad on a wafer (c) Wire resistance of a wiring line between a tunnel junction and a pad in a wafer, in which a TMR element is formed (d) Output impedance of the power-supply unit 311 and input impedance of the current-detection unit 321

For example, when the stray resistance is 20Ω, the element current is 2 mA, and the bias voltage is 0.1V, a voltage drop caused by stray resistance is 40 mV. Accordingly, the voltage drop reaches 40% of the bias voltage. That is, the bias voltage applied to the tunnel junction is reduced to 60 mV. Therefore, since the MR ratio changes with the characteristic shown in FIG. 3, an error-occurs in magnetic-field angle measurement. The magnetic-field-angle measurement apparatus of the present embodiment is a solution to such a problem and the like.

The magnetic-field-angle measurement apparatus is configured to include the TMR element 51 and the magnetic-field-angle detection circuit 302. The TMR element 51 has first and second sensing terminals 75 and 76 in addition to the first and second feeding terminals 71 and 72. The power-supply unit 311 of the magnetic-field-angle detection circuit 302 has an input terminal, through which outputs of the first and second sensing terminals 75 and 76 are input, in addition to an output terminal through which a voltage is output to the first feeding terminal 71.

A voltage signal of the second sensing terminal 76 is connected to the reference-voltage generation unit 316. The reference-voltage generation unit 316 generates a desired voltage value Vref and outputs a voltage obtained by superimposing the voltage value Vref on the input signal.

The output of the reference-voltage generation unit 316 and the signal input to the first sensing terminal 75 are input to a differential amplifier 315. The output of the differential amplifier 315 is input to a power amplifier 317, and the output of the power amplifier 317 is output to the first feeding terminal 71 of the TMR element 51. In the fourth embodiment, the voltage-amplification factor of the power amplifier is set to 1.

Figure 9:
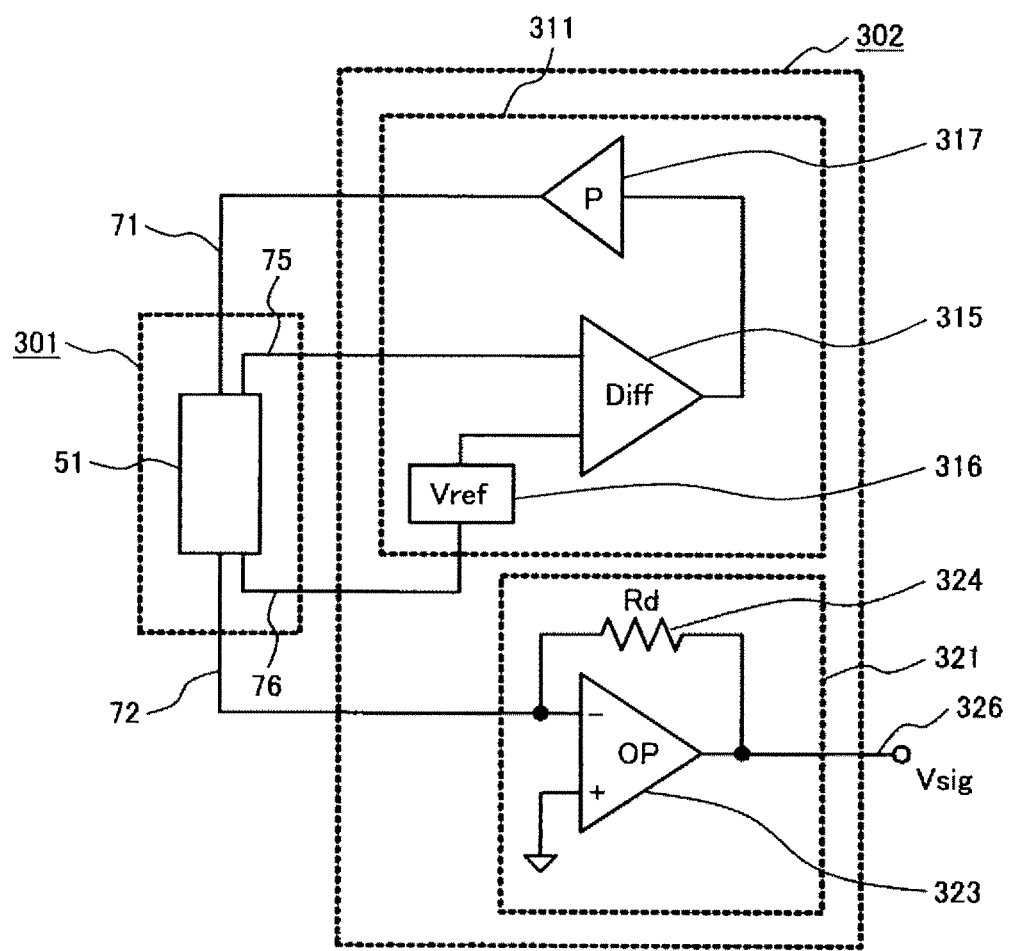
FIG. 9 is a circuit diagram showing the configuration of the fourth embodiment of the present invention.

As shown in FIG. 9, in the configuration of the fourth embodiment, the first sensing terminal 75 is input to the input terminal of the differential amplifier 315, and the second sensing terminal 76 is connected to the input terminal of the differential amplifier 315 through the reference-voltage generation unit 316. Since a current does not flow through the input terminal of the differential amplifier 315, a current does not flow through any sensing terminal. Accordingly, since a voltage drop caused by a wiring line or the like can be neglected, the voltage across the tunnel junction of the TMR element 51 can be accurately detected. The second feeding terminal 72 of the TMR element is connected to the current-detection unit 321. The current-detection unit 321 is formed of a circuit with an input impedance of zero as in the first embodiment.

In this configuration, a voltage between the first and second sensing terminals 75 and 76 of the TMR element is fed back so as to become equal to the set voltage value Vref of the reference-voltage generation unit 316, and the voltage is applied. Accordingly, the bias voltage applied to the junction of the TMR element 51 is maintained at Vref.

Figure 10:
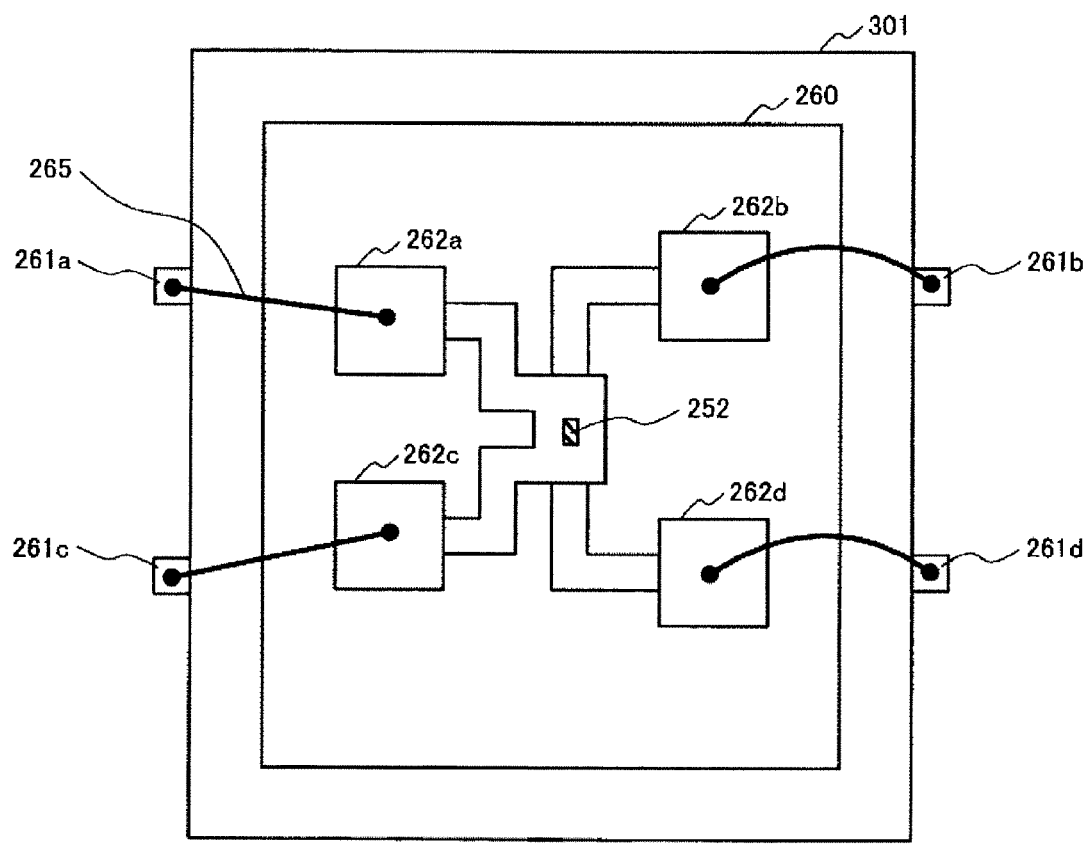
FIG. 10 is a schematic diagram showing the configuration of a magnetic sensor of the fourth embodiment of the present invention.

FIG. 10 is a schematic diagram showing wiring lines on a wafer 260 which forms the TMR element 51. As shown in the drawing, in the magnetic sensor 301 having the TMR element 51, a wafer pad 262a corresponding to the first feeding terminal 71 and a wafer pad 262c corresponding to the first sensing terminal 75 are connected to a tunnel junction 252 of the TMR element 51 through separate wiring paths. Similarly, a wafer pad 262b corresponding to the second feeding terminal 72 and a wafer pad 262d corresponding to the second sensing terminal 76 are connected to the tunnel junction 252 through separate wiring paths.

For this reason, even if a voltage drop occurs in a path of the first feeding terminal 71 to the tunnel junction 252 through which a current flows, the voltage of the tunnel junction 252 can be detected through the first and second sensing terminals 75 and 76. 265 is a bonding wire which connects the wafer pads 262a to 262d and the package terminals 261a to 261d each other.

Moreover, in the present embodiment, as shown in FIG. 10, the configuration in which the wiring lines on the wafer of the TMR element 51 are separated from each other is shown. However, when the wire resistance is a magnitude that can be neglected, it is needless to say that the wiring lines on the wafer do not need to be separated from each other.

Fifth Embodiment

Figure 11:
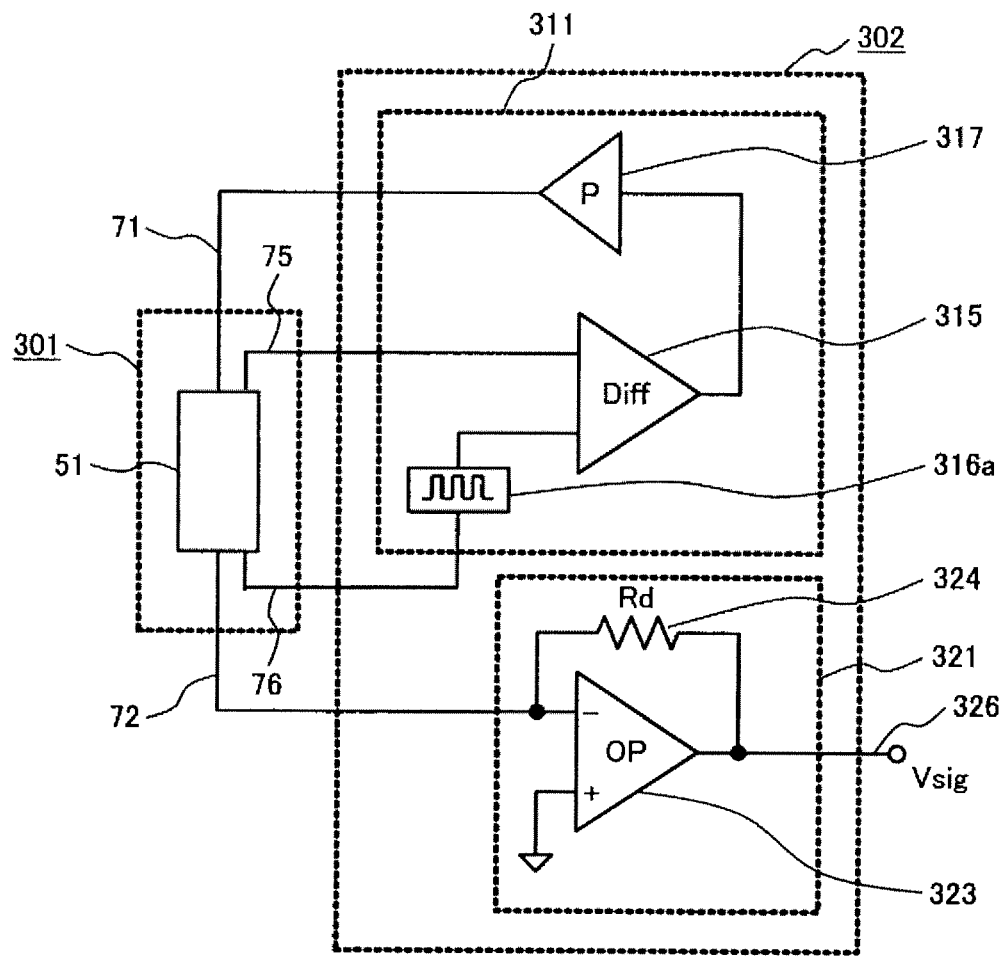
FIG. 11 is a circuit diagram showing the configuration of the fifth embodiment of the present invention.

Next, a fifth embodiment of the magnetic-field-angle measurement apparatus according to the present invention will be described with reference to FIG. 11. In FIG. 11, the reference-voltage generation unit 316 in FIG. 9 is replaced with a reference-voltage generation unit 316a. In the present embodiment, the reference-voltage generation unit 316a generates a pulsed voltage.

In this case, since electric power supplied to the TMR element 51 decreases according to the duty factor of pulse, heating of the TMR element 51 is suppressed. As a result, a drift of the element current is reduced, and it is possible to obtain an accurate measurement result with good reproducibility. In addition, degradation of the TMR element is less likely to occur because power supplied to the TMR element 51 is reduced. Also on this point, the present invention is preferable.

Sixth Embodiment

Figure 12:
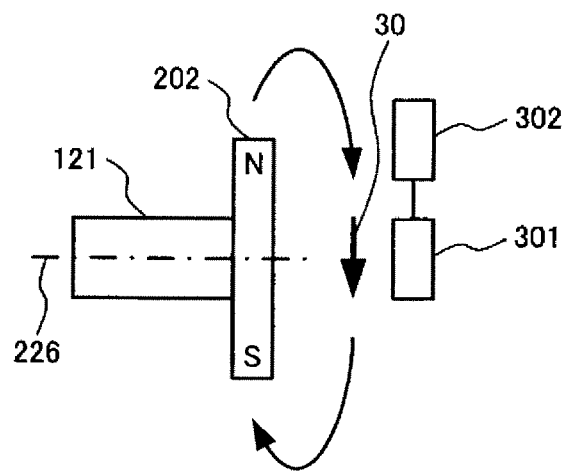
FIG. 12 is a schematic diagram showing the configuration of the sixth embodiment of the present invention.

Next, a rotation-angle measurement apparatus using the magnetic-field-angle measurement apparatus of the present invention will be described in a sixth embodiment with reference to FIG. 12. The rotation-angle measurement apparatus is configured to include a magnetic sensor 301 with a TMR element, a magnetic-field-angle detection circuit 302, and a magnet 202 provided in a rotation unit 121 that is an object to be measured. When the rotation unit 121 rotates around the rotation axis 226, the magnet 202 also rotates. By measuring the angle of magnetic field generated by the magnet 202, it is possible to measure the rotation angle of the rotation unit 201. As the magnetic sensor 301 and the magnetic-field-angle detection circuit 302 used in the sixth embodiment, those with the same configuration as described in FIG. 9 are used.

In particular, it is preferable that the TMR element in the magnetic sensor 301 be disposed at the position on the extension line of the rotation axis of the rotation unit. The reason is that the rotation angle of the rotation unit 121 can be accurately measured because the angle of the magnetic field generated by the magnet 202 and the rotation angle of the rotation unit 121 are equal in this arrangement.

For the magnetic-field intensity generated by the magnet 202, it is preferable that the magnetic-field intensity at the location of the TMR element be equal to or greater than 10 mT. By setting such magnetic-field intensity, the TMR element operates in a saturation state with respect to the magnetic field. That is, all the spins in the free magnetic layer 11 are arrayed along the angle of the magnetic field. For this reason, even if the magnetic-field intensity changes slightly due to the influence of ambient temperature or the like, the angle of magnetic field can be correctly calculated. Accordingly, the rotation angle of the rotation unit can be accurately measured.

As the magnet 202, a ferrite magnet may be used, or a neodymium magnet or a samarium-cobalt magnet may be used. In the present embodiment, the neodymium magnet is used.

Seventh Embodiment

Next, a seventh embodiment regarding the magnetic-field-angle measurement apparatus of the present invention will be described using FIGS. 13 and 14. In the seventh embodiment, the magnetic-field angle can be measured in the entire angle range of 0 to 360° using two TMR elements.

Figure 13:
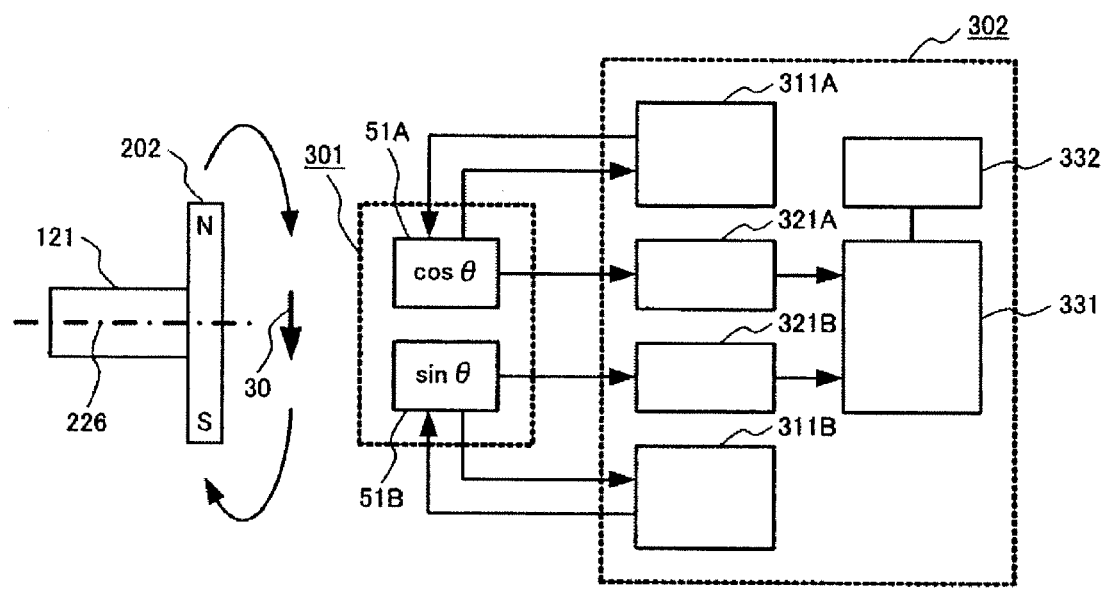
FIG. 13 is a block diagram showing the configuration of the seventh and eighth embodiments of the present invention.

FIG. 13 is a block diagram showing the overall configuration of a rotation-angle measurement apparatus including the magnetic-field-angle measurement apparatus of the seventh embodiment. In the magnetic sensor 301, two TMR elements 51a and 51b are disposed. The magnetic-field-angle measurement apparatus is configured to include the magnetic sensor 301 and the magnetic-field-angle detection circuit 302.

Figure 14:
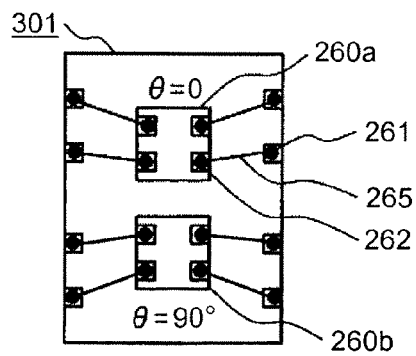
FIG. 14 is a schematic diagram showing the configuration of a magnetic sensor used in the seventh and eighth embodiments of the present invention.

FIG. 14 is a schematic diagram showing the arrangement of a TMR-element package which is the magnetic sensor 301. The angle of a TMR element wafer 260a in the angle of magnetization 22 of the pinned magnetic layer is 0, while the angle θp of a TMR element wafer 260b in the angle of magnetization 22 of the pinned magnetic layer is set to 90°. As in FIG. 10, package terminals 261 corresponding to the first and second feeding terminals and the first and second sensing terminals are provided in each element. These are connected to wafer pads 262 of the TMR element wafers 260a and 260b through a bonding wire 265.

In the TMR element 50b, the angle of magnetization 22 of the pinned magnetic layer is shifted by 90°. Accordingly, the magnetic-field angle dependence of the conductance is calculated by substituting (θ−90°) into (Expression 3). That is, this is as follows.

$$G(\theta) = G_0 + \frac{T}{2}\cos(\theta - 90°) = G_0 + \frac{T}{2}\sin\theta = G_0 + \frac{G_0 \beta_g}{2}\sin\theta \quad \text{[Expression 8]}$$

Accordingly, since cos θ and sin θ can be obtained by calculating the conductance by measuring the element current of each of the TMR elements 51a and 51b and removing a magnetic-field independent term G0, it is possible to calculate the magnetic-field angle θ by the arctangent transformation (arc tangent transformation).

Next, the configuration of the magnetic-field-angle measurement apparatus of the seventh embodiment will be described with reference to FIG. 13. The magnetic-field-angle detection circuit 302 has a power-supply unit 311A and a current-detection unit 321A corresponding to the TMR element 51a and a power-supply unit 311B and a current-detection unit 321B corresponding to the TMR element 51b, and further has a signal-processing unit 331 and a parameter storage unit 332.

The configuration of the power-supply unit 311A and the current-detection unit 321A is the same as that shown in FIG. 9. That is, the power-supply unit 311A is connected to each terminal of the TMR element 51a, and feeds back the applied voltage so that the bias voltage applied to the tunnel junction 252 of the TMR element 51a becomes a fixed value. In addition, the current-detection unit 321A measures an element current Id(A) flowing through the TMR element 51a.

The configuration of the power-supply unit 311B and the current-detection unit 321B is the same as that shown in FIG. 9. Similarly, the current-detection unit 321B measures an element current Id(B) flowing through the TMR element 51b.

Since the element current is proportional to the conductance of the TMR element, each element current is expressed by the following Expression, as can be seen from (Expression 3) and (Expression 8).

$$I_d(A) = e_0 G(A, \theta) = e_0 G_0 + \frac{e_0 T}{2}\cos\theta \quad \text{[Expression 9]}$$

$$I_d(B) = e_0 G(B, \theta) = e_0 G_0 + \frac{e_0 T}{2}\sin\theta$$

Here, e0 is a reference voltage set in the reference-voltage generation unit 316 within each of the power-supply units A311A and B311B. The bias voltage applied to the TMR elements 51A and 51B is equal to e0. In addition, signal processing is simplified by setting the bias voltage applied to the TMR elements 51A and 51B to the same value e0.

Signals corresponding to the values of the element currents Id(A) and Id(B) are input to the signal-processing unit 331. In the signal-processing unit 331, values obtained by subtracting the constant term e0G0 in (Expression 9) from the element currents are calculated as Id'(A) and Id'(B), respectively. The method of calculating the value of the constant term e0G0 to be subtracted will be described later. In this manner, as can be seen from (Expression 9), the magnetic field θ is calculated from the following Expression by ArcTan processing (arc tangent processing).

$$\theta = \alpha\tan2(I'_d(B), I'_d(A)) = \alpha\tan2\left(\frac{e_0 T}{2}\sin\theta, \frac{e_0 T}{2}\cos\theta\right) \quad \text{[Expression 10]}$$

Here, θ=a tan 2(y, x) is a function which outputs the value of θ=0 to 360° (or −180 to 180°) appropriately according to whether the arguments x and y are positive or negative. For example, a tan 2(y, x)=ArcTan(y/x) when both x and y are positive, and a tan 2(y, x)=ArcTan(y/x)+180° when both x and y are negative. As described above, the magnetic-field angle θ is calculated.

Next, the method of calculating the constant term e0G0 in (Expression 9) will be described. Ina period of N rotations (N≥1) made by rotating the rotation unit at fixed speed, the element currents Id(A) and Id(B) are sampled at some points. When the number of sampling points is 100 or more, the accuracy is improved. If the average value is calculated for each of the sampled Id(A) values and Id(B) values, the following Expression is obtained since the second term is zero from symmetry of cos θ and sin θ.

$$\text{average}(I_d(A))=e_0 G_0$$

$$\text{average}(I_d(B))=e_0 G_0 \quad \text{[Expression 11]}$$

Here, average (x) indicates a process of calculating the average value. In this manner, it is possible to calculate the constant term e0G0. The calculated e0G0 value is stored in the parameter storage unit 332, and is used for the process of calculating Id'(A) from the above-described Id(A).

The coefficient e0T in (Expression 9) does not need to be calculated from the following reason. The reason is that the coefficients e0T cancel each other out since a tan 2(y, X) processing in (Expression 10) is a process of calculating the arc tangent of the ratio, for example, like ArcTan(y/x).

Eighth Embodiment

Next, a rotation-angle measurement apparatus using the magnetic-field-angle measurement apparatus of the seventh embodiment will be described in an eighth embodiment using FIG. 13 again. In the eighth embodiment, the rotation-angle measurement apparatus is configured to include a magnet 202 fixed to the rotation unit 121 which rotates around the rotation axis 226, a magnetic sensor 301, and a magnetic-field-angle detection circuit 302.

It is preferable that the magnetic sensor 301 be disposed on the extension line of the rotation axis 226 of the rotation unit 121. The reason is that the rotation angle of the rotation unit can be accurately measured because the angle of the magnetic field generated by the magnet 202 and the actual rotation angle are equal in this arrangement.

For the magnetic-field intensity generated by the magnet 202, it is preferable that the magnetic-field intensity at the location of the magnetic sensor 301 formed of a TMR element be equal to or greater than 10 mT. By setting such magnetic-field intensity, the TMR element operates in a saturation state with respect to the magnetic field. That is, all the spins in the free magnetic layer 11 are aligned to the same angle with the magnetic-field angle. For this reason, even if the magnetic-field intensity changes slightly due to the influence of the ambient temperature or the like, the angle of magnetic field can be correctly calculated. Accordingly, the rotation angle of the rotation unit can be accurately measured.

As the magnet 202, a ferrite magnet may be used, or a neodymium magnet or a samarium-cobalt magnet may be used. In the present embodiment, the neodymium magnet is used.

As described in the magnetic-field-angle measurement apparatus of the seventh embodiment, the magnetic-field angle at the point of the magnetic sensor 301 can be measured with high accuracy over the entire range of 0 to 360' by using the magnetic sensor 301 and the magnetic-field-angle detection circuit 302 in this configuration. Therefore, the rotation angle of the rotation unit 121 can be measured with high accuracy by measuring the angle of magnetic field generated by the magnet 202 placed in the rotation unit 121.

Ninth Embodiment

Next, a ninth embodiment in which the rotation-angle measurement apparatus according to the present invention is applied to a motor will be described using FIG. 15. In the present embodiment, a motor unit 100 and a rotation-angle-detection unit 200 are provided.

The motor unit 100 generates a rotational torque by rotation of a plurality of rotatable magnetic poles due to magnetic interaction of a plurality of fixed magnetic poles and a plurality of rotatable magnetic poles, and includes a stator 110 which forms a plurality of fixed magnetic poles and a rotor 120 which forms a plurality of rotatable magnetic poles. The stator 110 is configured to include a stator core 111 and a stator coil 112. The rotor 120 is disposed at the inner peripheral side of the stator 110 so as to face each other with an air gap therebetween, and is rotatably supported. In the present embodiment, a surface permanent magnet synchronous motor of three-phase ac type is used as the motor 100.

A case is comprised of first and second brackets 102 and 103 provided at both ends of a cylindrical frame 101 in its axis direction. A bearing 106 is provided in a hollow portion of the first bracket 102, and a bearing 107 is provided in a hollow portion of the second bracket 103. These bearings support a rotation unit 121 so as to be rotatable.

A sealant (not shown) formed of a ring-shaped O-ring is provided between the frame 101 and the first bracket 102. The sealant is sandwiched and compressed from the axial direction and the radial direction by the frame 101 and the first bracket 102. As a result, the front side is waterproofed by sealing between the frame 101 and the first bracket 102. In addition, waterproofing by the sealant is also made between the frame 101 and the second bracket 103.

Next, the configuration of the rotation-angle-detection unit 200 will be described. The rotation-angle-detection unit 200 is configured to include a magnetic-sensor module 201, which measures a magnetic-field angle, and a sensor magnet 202. The rotation-angle-detection unit 200 is placed in the space surrounded by the housing 203 and the second bracket 103. The sensor magnet 202 is placed at a shaft which rotates in conjunction with the rotation unit 121. When the rotation position of the rotation unit 121 changes, the angle of the generated magnetic field changes according to the change. By detecting the angle of this magnetic field with the magnetic-sensor module 201, it is possible to measure the rotation angle (rotation position) of the rotation unit 121.

If the magnetic-sensor module 201 is placed on the rotation axis 226 of the rotation unit 121, a distortion in the spatial distribution of the magnetic field generated by the sensor magnet 202 is reduced. For this reason, this arrangement is preferable. The sensor magnet 202 is a two-pole magnet that is magnetized in two-pole form, or a multi-pole magnet that is magnetized in multiple-pole form, in more than or equal to 4 poles. The magnetic-sensor module 201 is configured to include the magnetic sensor and the magnetic-field-angle detection circuit unit shown in FIGS. 13 and 14 of the seventh embodiment, and the magnetic-field-angle detection circuit unit has a signal-processing unit.

An output signal of the magnetic sensor changes depending on the angle of magnetic field. In the ninth embodiment, a magnetic sensor having two TMR elements whose angles θp of magnetization vector 22 of a pinned magnetic layer are shifted by 90° from each other is used.

The magnetic-sensor module 201 is placed in the housing 203. Preferably, the housing 203 is formed of a material with magnetic susceptibility of 0.1 or less, such as aluminum or resin, so as not to be affected by the angle of magnetic flux. In the ninth embodiment, the housing 203 is formed of aluminum.

In addition, the magnetic-sensor module 201 may be fixed to the motor unit, or may undoubtedly be fixed to components other than the housing 203. This is because, if the magnetic-sensor module 201 is fixed to the motor unit, the rotation angle of the rotatable shaft 121 can be detected by detecting an angle of a magnetic field change in the magnetic-sensor module 201 when the direction of the sensor magnet 202 changes due to a change in the rotation angle of the rotatable shaft 121.

A sensor wiring line 208 is connected to the magnetic-sensor module 201. An output signal of the magnetic field sensor 201 is transmitted through the sensor wiring line 208.

Figure 16:
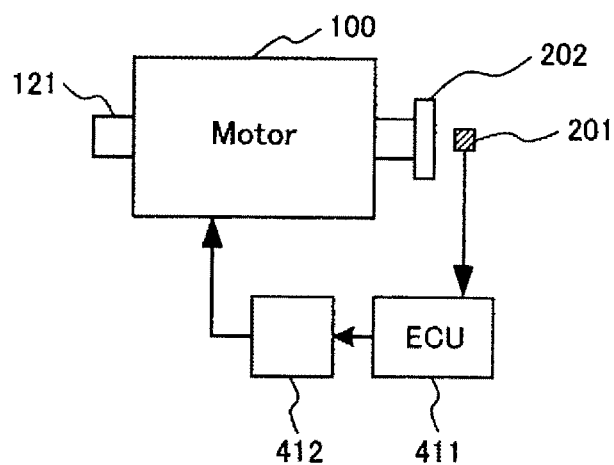
FIG. 16 is a block diagram showing a motor control method of the ninth embodiment of the present invention.

FIG. 16 shows a control system of the motor unit of the rotation-angle measurement apparatus which is the present embodiment. A signal from the magnetic-sensor module 201 is input to an electronic control unit (ECU) 411, and the ECU 411 transmits control commands to a drive unit 412. The drive unit 412 controls the rotational speed and/or rotational position of the rotor 121 by outputting an appropriate voltage waveform to the stator 110 of the motor unit 100.

Figure 15:
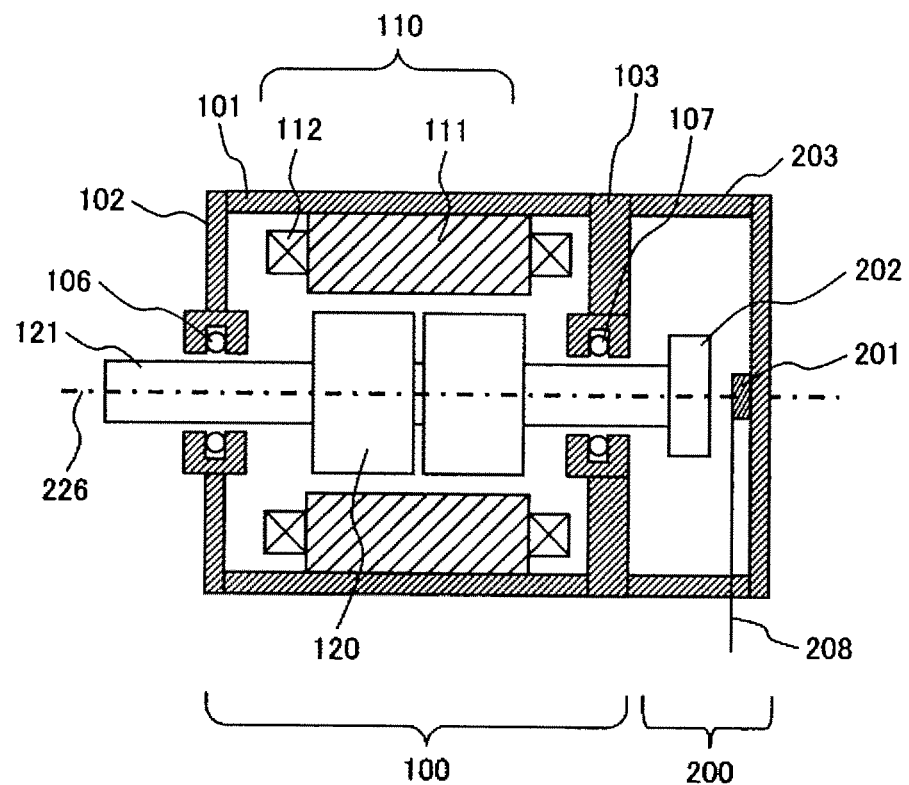
FIG. 15 is a schematic diagram showing the configuration of the ninth embodiment of the present invention.

According to the ninth embodiment, since the angle of the magnetic field can be accurately measured by the configuration shown in FIG. 13, it is possible to measure the rotation angle of the rotor 121 accurately in the configuration shown in FIGS. 15 and 16. For this reason, high-accuracy control in the drive unit 412 is possible. In this manner, a motor which is high in energy efficiency can be realized. Alternatively, it is possible to realize a high-accuracy motor which responds to a command angle (instructed angle) accurately.

In addition, the magnetic-sensor module 201 may be formed of only the magnetic sensor 301, or the magnetic-field-angle detection circuit 302 may be formed in the ECU 411.

Tenth Embodiment

Figure 17:
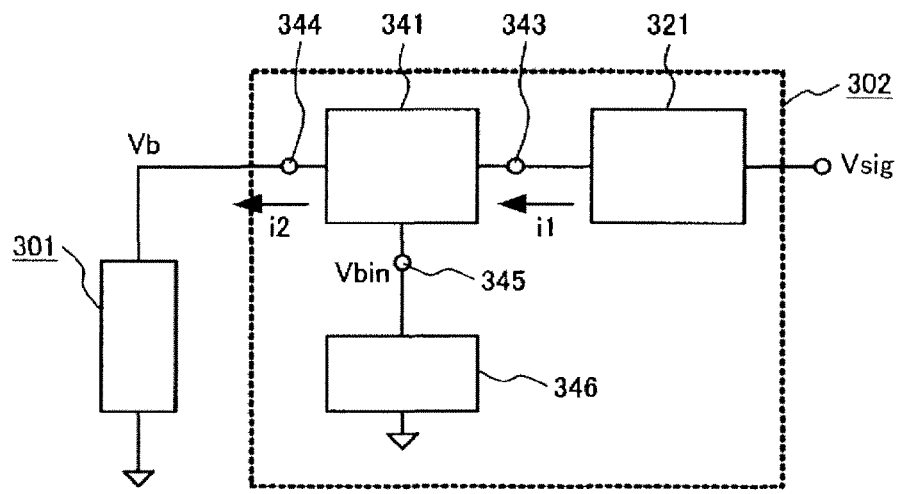
FIG. 17 is a block diagram showing the configuration of the tenth embodiment of the present invention.

Next, a tenth embodiment of the magnetic-field-angle measurement apparatus according to the present invention will be described using FIGS. 17 to 19. As shown in FIG. 17, a magnetic-field-angle measurement apparatus of the tenth embodiment is configured to include a magnetic sensor 301 and a magnetic-field-angle detection circuit 302. A TMR-element package is used as the magnetic sensor 301.

The magnetic-field-angle detection circuit 302 of the tenth embodiment is configured to include a current-supply unit 341, a voltage-generation unit 346, and a current-detection unit 321. The current-supply unit 341 has a current-input terminal 343, a current-output terminal 344, and a voltage-input terminal 345.

The current-supply unit 341 is formed as follows. That is, a current i2 output from current-output terminal 344 is set to be equal to a current i1 input to the current-input terminal 343, and an output voltage Vb of the current-output terminal 344 is set by a voltage Vbin input to the voltage-input terminal 345.

Here, "the output voltage Vb is set by the input voltage Vbin of the voltage-input terminal" means that the input value Vbin and the output value Vb correspond in a one-to-one relationship. Specifically, there is a case where the input voltage Vbin and the output voltage Vb are equal, a case where the value proportional to the input voltage Vbin is output as the output voltage Vb, and the like.

In FIG. 17, a terminal of the magnetic sensor 301 is connected to the current-output terminal 344 of the current-supply unit 341. The current-detection unit 321 is connected to the current-input terminal 343. The voltage-generation unit 346 is connected to the voltage-input terminal 345.

Through such a configuration, the voltage applied to the terminal of the magnetic sensor 301, that is, a TMR-element package can be maintained at the fixed value Vb. In this case, since the current i2 flowing through the magnetic sensor 301 is equal to the current-input terminal current i1 of the current-supply unit 341, it is possible to measure the current i2 by the current-detection unit 321. Therefore, since the TMR element current can be measured while maintaining the terminal voltage of the TMR element constant, it is possible to measure the magnetic-field angle with high accuracy even if a TMR element with a high MR ratio is used.

Directions of the arrows of the current i1 and i2 in FIG. 17 are described assuming that the voltage polarity of the current-output terminal 344 is positive and positive current flows from the current-supply unit 341 toward the magnetic sensor 301. When the voltage polarity of the current-output terminal 344 is negative, current flows from the magnetic sensor 301 toward the current-supply unit 341. In this case, however, it is preferable to assume that negative current flows from the current-output terminal 344 and the negative current flows to the current-input terminal 343. That is, the configuration of the present embodiment is satisfied regardless of the direction of the current (that is, positive or negative current value) output from the current-output terminal 344, so that the desired effects are obtained.

Next, the detailed configuration of the current-supply unit 341 will be described using FIG. 18. FIG. 18 is an example where the current-supply unit 341 is configured to include an operational amplifier 351 and a field-effect transistor (FET) 352. A voltage of the current-output terminal 344 is fed back to one input terminal of the operational amplifier 351.

The voltage-generation unit 346 is connected to the voltage-input terminal 345. The current-detection unit 321 is connected to the current-input terminal 343, and the magnetic sensor 301 is connected to the current-output terminal 344.

When the voltage Vb of the voltage-input terminal 345 is input, the voltage of the current-output terminal 344 becomes equal to Vb due to the function of the operational amplifier 351. In addition, since it can be regarded that the input impedance of the signal input terminal of the operational amplifier 351 is infinite, the current-input terminal current i1 and the current-output terminal current i2 become equal. That is, it can be seen that the function of the current-supply unit is satisfactory.

In the tenth embodiment, the current-detection unit 321 is formed of a current-follower circuit. The output voltage of the signal output terminal 326 is Rd×i1=Rd×i2. In this manner, it is possible to measure the current i2 flowing through the magnetic sensor 301.

Figure 19:
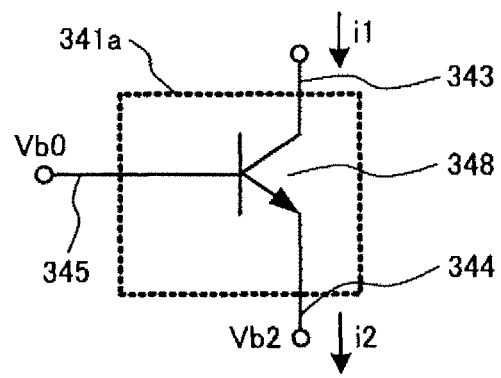
FIG. 19 is a circuit diagram showing a modification of FIG. 17.

FIG. 19 shows another circuit of the current-supply unit 341. In FIG. 19, a current-supply unit 341a is realized using a transistor 348. A base of the transistor 348 is connected to the voltage-input terminal 345, an emitter is connected to the current-output terminal 344, and a collector is connected to the current-input terminal 343. In this case, the relationship of Vb2=Vb0−Vbe is satisfied between the input voltage Vb0 of the voltage-input terminal 345 and the terminal voltage Vb2 of the current-output terminal 344. Vbe is a base-emitter voltage dominated by the junction characteristics of a transistor, and is a constant voltage of about 0.7 V. Accordingly, the terminal voltage of the current-output terminal 344 is maintained constant at Vb2, and the current i2 is equal to the flowing current i1 of the current-input terminal 343.

In addition, since Vbe changes slightly due to a large temperature change and the like, there is an advantage in that the configuration shown in FIG. 19 has a high performance but includes only one transistor and accordingly can be realized at a low cost.

Eleventh Embodiment

An eleventh embodiment of the magnetic-field-angle measurement apparatus of the present invention will be described using FIG. 20. In the eleventh embodiment, a current-mirror circuit is used as the current-detection unit 321 in the configuration of the magnetic-field-angle detection circuit 302 shown in FIG. 17 of the tenth embodiment. The current-mirror circuit is a circuit in which flowing currents i1 and i3 of two terminals are equal, and various configurations are known.

Figure 20:
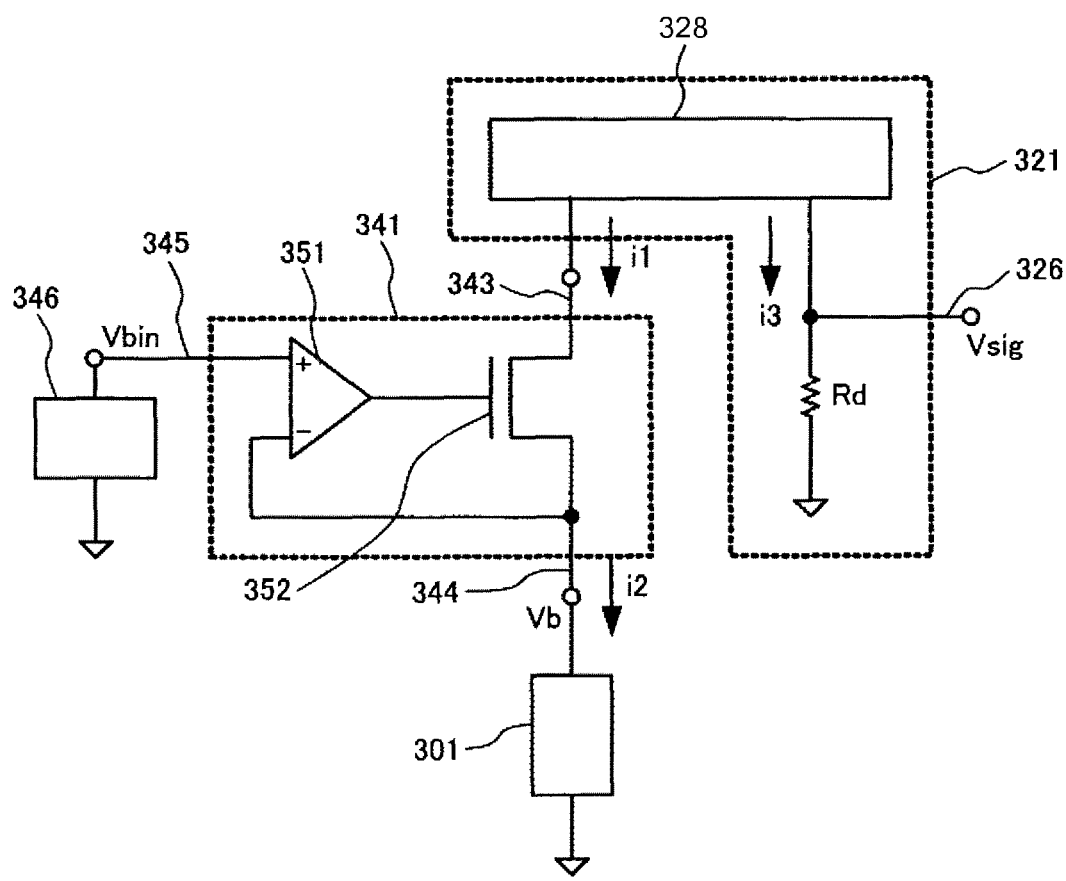
FIG. 20 is a circuit diagram showing the configuration of the eleventh embodiment of the present invention.

As shown in FIG. 20, when the current-detection unit 321 is formed using a current-mirror circuit 326, the currents i1 and i3 are equal. The magnitude of the current i3 is converted into a voltage by the detection resistor Rd, and the output voltage Vsig of the signal output terminal 326 is set to (Rd×i3).

Figure 18:
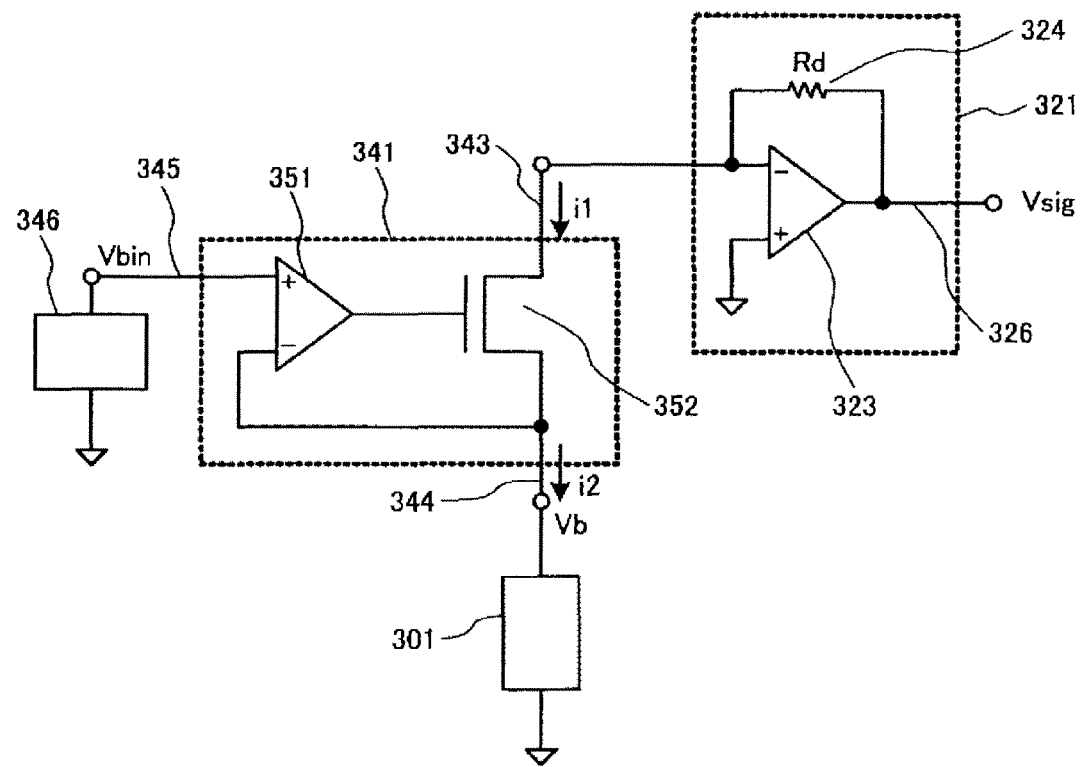
FIG. 18 is a circuit diagram showing the detailed circuit configuration of FIG. 17.

As described in FIG. 18, the current-supply unit 341 operates such that i1 and the flowing current i2 of the magnetic sensor 301 become equal. Accordingly, it is possible to measure the flowing current i2 of the magnetic sensor 301 by measuring the current i3.

As described above, the voltage applied to the magnetic sensor 301 is maintained at the fixed value Vb by the function of the current-supply unit 341. Therefore, even if the magnetic sensor 301 using a TMR element with a high MR ratio is used, it is possible to measure the magnetic-field angle with high accuracy.

In FIGS. 17, 18, and 20, when the voltage-generation unit 346 generates a pulsed voltage, the pulsed voltage is applied to the magnetic sensor 301 formed of a TMR element. In this case, since electric power supplied to the TMR element decreases according to the duty factor of pulse, heating of the element is suppressed. As a result, a drift of the element current is reduced, and it is possible to obtain an accurate measurement result with good reproducibility. In addition, degradation of the TMR element is less likely to occur because power supplied to the TMR element is reduced. Also on this point, the present invention is preferable.

In the tenth and eleventh embodiments, the magnetic-field-angle measurement apparatus has been described. However, a rotation-angle measurement apparatus which measures the rotation angle of the rotation unit 121 with high accuracy can be realized by combining the magnetic-field-angle measurement apparatus in the tenth and eleventh embodiments with the magnet 202 placed in the rotation unit 121 in the same manner as shown in FIG. 12 or 13.

REFERENCE SIGNS LIST

11: free magnetic layer
12: tunnel-insulator layer
13: pinned magnetic layer
51: TMR element
71: first feeding terminal
72: second feeding terminal
75: first sensing terminal
76: second sensing terminal
121: rotation unit
200: rotation-angle-detection unit
201: magnetic-field-angle measurement apparatus
202: magnet
226: rotation axis 252: tunnel junction
301: magnetic sensor
302: magnetic-field-angle detection circuit
311: power-supply unit
315: differential amplifier
316: reference-voltage generation unit
321: current-detection unit
323: operational amplifier
326: signal output terminal
328: current-mirror circuit
341: current-supply unit
343: current-input terminal
344: current-output terminal
345: voltage-input terminal
346: voltage-generation unit

The invention claimed is:

1. A magnetic-field-angle measurement apparatus comprising:
   a magnetic sensor; and
   a magnetic-field-angle detection circuit,
   wherein the magnetic sensor has a tunneling magnetoresistance element with a pinned magnetic layer,
   the tunneling magnetoresistance element of the magnetic sensor has first and second feeding terminals and a first sensing terminal,
   the magnetic-field-angle detection circuit has a power-supply unit that outputs a constant voltage as a bias voltage to the tunneling magnetoresistance element of the magnetic sensor and a current-detection unit that detects a flowing current through the tunneling magnetoresistance element,
   a terminal voltage of the tunneling magnetoresistance element is detected through the first sensing terminal, and
   the power-supply unit performs feedback control such that the terminal voltage matches a predetermined voltage value,
   wherein the power-supply unit has a differential amplifier with differential inputs of an output voltage of the first sensing terminal and an output of a reference-voltage generation unit,
   wherein the tunneling magnetoresistance element has a second sensing terminal in addition to the first sensing terminal, the second sensing terminal connected to an input terminal of the differential amplifier through the reference-voltage generation unit.

2. The magnetic-field-angle measurement apparatus according to claim 1,
   wherein the terminal voltage of the tunneling magnetoresistance element is detected through the first and second sensing terminals.

3. The magnetic-field-angle measurement apparatus according to claim 1,
   wherein the magnetic sensor has two tunneling magnetoresistance elements in which angles of magnetization of the pinned magnetic layers are different from each other by 90°.

4. A rotation-angle measurement apparatus comprising:
   the magnetic-field-angle measurement apparatus according to claim 1; and
   a magnet fixed to a rotation unit.

* * * * *